United States Patent [19]

Yamamoto

[11] Patent Number: 4,874,684
[45] Date of Patent: Oct. 17, 1989

[54] LIGHT-SENSITIVE MATERIAL CONTAINING SILVER HALIDE, REDUCING AGENT AND POLYMERIZABLE COMPOUND IN MICROCAPSULES SEPARATELY SENSITIZED

[75] Inventor: Soichiro Yamamoto, Kanagawa, Japan

[73] Assignee: Fuji Photo Film Co., Ltd., Kanagawa, Japan

[21] Appl. No.: 92,841

[22] Filed: Sep. 3, 1987

[30] Foreign Application Priority Data

Sep. 3, 1986 [JP] Japan .................................. 61-208786

[51] Int. Cl.$^4$ .............................................. G03C 1/72
[52] U.S. Cl. ..................................... 430/138; 430/944
[58] Field of Search ................................. 430/138, 944

[56] References Cited

U.S. PATENT DOCUMENTS

| 3,505,068 | 4/1970 | Beckett et al. | 430/138 |
| 3,694,252 | 9/1972 | Gerber et al. | 430/138 |
| 3,694,253 | 9/1972 | Gerber et al. | 430/138 |
| 4,536,463 | 8/1985 | Sanders | 430/138 |
| 4,624,910 | 11/1986 | Takeda | 430/213 |
| 4,629,676 | 12/1986 | Hayakawa et al. | 430/203 |
| 4,636,453 | 1/1987 | Keys et al. | 430/138 |
| 4,649,098 | 3/1987 | Takeda | 430/270 |

FOREIGN PATENT DOCUMENTS 0203613 12/1986 European Pat. Off. .

Primary Examiner—Paul R. Michl
Assistant Examiner—Patrick N. Doody
Attorney, Agent, or Firm—Sughrue, Mion, Zinn, Macpeak & Seas

[57] ABSTRACT

A light-sensitive material comprising a light-sensitive layer which contains silver halide, a reducing agent, a polymerizable compound and a color image forming substance provided on a support, wherein the silver halide, the polymerizable compound and the color image forming substance are contained in at least three kinds of microcapsules (I), (II) and (III) which are dispersed in the light-sensitive layer. Each of the microcapsules (I), (II) and (III) differs from each other with respect to the spectral sensitivity of the silver halide. The hue of the color image forming substance contained in the microcapsule (I) is the same as that in the microcapsule (II), and the hue of the color image forming substance contained in the microcapsule (III) is different from those in the microcapsules (I) and (II).

6 Claims, No Drawings

LIGHT-SENSITIVE MATERIAL CONTAINING SILVER HALIDE, REDUCING AGENT AND POLYMERIZABLE COMPOUND IN MICROCAPSULES SEPARATELY SENSITIZED

BACKGROUND OF THE INVENTION

1. Field of the invention

This invention relates to a light-sensitive material comprising a light-sensitive layer which contains silver halide, a reducing agent, a polymerizable compound and a color image forming substance provided on a support.

2. Description of prior art

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Provisional Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 01746342A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method also described in Japanese Patent Provisional Publication Nos. 61(1986)-183640, 61(1986)-188535 and 61(1986)-22841.

The above-mentioned image forming methods are based on the principle in which the polymerizable compound is polymerized within the area where a latent image of the silver halide has been formed.

Further, Japanese Patent Provisional Publication No. 61(1986)-260241 describes another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area is polymerized.

In the light-sensitive materials which are used for the above-mentioned image forming methods, a color image forming substance can be contained in the light-sensitive-layer of the material to form a color image. The light sensitive material containing the color image forming substance is described in Japanese Patent Provisional Publication No. 61(1986)-73145 (corresponding to U.S. Pat. No. 4,629,676 and European Patent Provisional Publication No. 0174634A2).

Further, the silver halide, the polymerizable compound and the color image forming substance can be contained in microcapsules which are dispersed in the light sensitive layer. The light-sensitive material employing microcapsules is described in Japanese Patent Provisional Publication No. 61(1986)-275742. The light-sensitive material containing such microcapsules has an advantage in that an image improved in the sharpness can be obtained.

SUMMARY OF THE INVENTION

The present inventor has noted that the hue of an image can be optionally varied according to the exposure condition, in the case that a light-sensitive material employs at least two kinds of microcapsules which differ with respect to both the spectral sensitivity of the silver halide (the range of the spectral sensitivity is hereinafter referred to as "band") and the hue of the color image forming substance.

An object of the present invention is to provide a light-sensitive material which can be employed in multi-band and multi-color systems and gives an image of the same hue in each of the systems.

Another object of the invention is to provide a light-sensitive material which can be employed not only for a natural color image forming system but also for a false color image forming system.

There is provided by the present invention a light sensitive material comprising a light-sensitive layer which contains silver halide, a reducing agent, a polymerizable compound and a color image forming substance provided on a support, wherein the silver halide, the polymerizable compound and the color image forming substance are contained in at least three kinds of microcapsules (I), (II) and (III) which are dispersed in the light-sensitive layer, each of the microcapsules (I), (II) and (III) differing from each other with respect to the spectral sensitivity of the silver halide, the hue of the color image forming substance contained in the microcapsule (I) being the same as that in the microcapsule (II), and the hue of the color image forming substance contained in the microcapsule (III) being different from those in the microcapsules (I) and (II).

The light-sensitive material of the invention is characterized in that the hue of the color image forming substance contained in the microcapsule (I) is the same as that in the microcapsule (II), while the microcapsules (I) and (II) differ from each other with respect to the spectral sensitivity of the silver halide. The microcapsules (I) and (II) can respectively function in each of two kinds of multi-band and multi-color systems and give the same hue in each of the obtained images. Therefore, the light-sensitive material of the present invention can give an image of the same hue in each of two or more systems.

The multi-band and multi-color systems, of course, include a natural color image forming system which has been employed in a conventional color photographic system. Various kinds of other systems than the natural color image forming system such as false color image forming systems are also frequently employed especially in the field of remote sensing (e.g., analysis of aerial photography). Further, a false color image forming system employed in other field is described in U.S. Pat. Nos. 4,463,079 and 4,474,867. As a result, many kinds of the light-sensitive materials should be prepared for each of the systems. Therefore, it is much advantageous that the light-sensitive material of the invention can be employed in two or more systems.

DETAILED DESCRIPTION OF THE INVENTION

In the light-sensitive material of the present invention, each of the microcapsules (I), (II) and (III) differs from each other with respect to the spectral sensitivity of the silver halide, the hue of the color image forming substance contained in the microcapsule (I) is the same as that in the microcapsule (II), and the hue of the color image forming substance contained in the microcapsule (III) is different from those in the microcapsules (I) and (II).

In the present invention, when the spectral sensitivities of the silver halides are different from each other, the difference between the largest peaks in the spectrum preferably is not less than 40 nm, more preferably not less than 60 nm. At a wave length of the largest peak of one silver halide in the spectrum, the silver halide preferably have a sensitivity of not smaller than five times those of the other silver halides, more preferably ten times.

Further, when the hues of the color image forming substances are different from each other, the difference between the largest peak in the spectrum preferably is not less than 60 nm, more preferably not less than 80 nm. At a wave length of the largest peak of one color image forming substance in the spectrum, the color image forming substance preferably have a density of not smaller than five times those of the other color image forming substances, more preferably ten times.

The spectral sensitivity of the silver halide can be varied by employing a spectral sensitizing dye, a chemical sensitizer, a super sensitizer, a stabilizer or an antifoggant. Among them, the spectral sensitizing dye is most preferably employed. The details of the spectral sensitizing dye will be given in the description of optional components of the light-sensitive layer.

The hue can be easily varied depending on the nature of the color image forming substance. Two or more kinds of the color image forming substances can be incorporated into a microcapsule to adjust the hue. The details of the color image forming substance will be given later.

The light-sensitive layer can further contain another microcapsule (IV) which differs from the microcapsules (I), (II) and (III) with respect to the spectral sensitivity of the silver halide and the hue of the color image forming substance. In the embodiment employing the microcapsule (IV), the three hues of the color image forming substances contained in the microcapsules (I), (II), (III) and (IV) can be yellow, magenta and cyan to give a full color image. The light-sensitive material of the invention can give an improved clear full color image which is reduced in the impurity of the color, because the interaction and transference of components between the neighboring image elements (i.e., microcapsules) are restricted by the microcapsule.

In a conventional system, the spectral sensitivities of the silver halide are arranged within visible regions (400 nm to 700 nm; e.g., blue, green and red). On the other hand, an infrared region (not shorter than 700 nm) is sometimes employed in place of the blue region, because the light source of the blue region is usually much more expensive than that of the infrared region. Therefore, it is convenient that the light-sensitive layer further contains another microcapsule (IV) which differs from the microcapsules (I), (II) and (II) with respect to the spectral sensitivity of the silver halide and the hue of the color image forming substance, the microcapsule (I) containing a blue sensitive silver halide as the silver halide, the microcapsule (II) containing an infrared sensitive halide as the silver halide, the microcapsule (III) containing a green sensitive silver halide as the silver halide, and the microcapsule (IV) containing a red sensitive silver halide as the silver halide.

Where the light-sensitive layer further contains another microcapsule (IV) which differs from the microcapsules (I), (II) and (III) with respect to the spectral sensitivity of the silver halide and the hue of the color image forming substance, the microcapsule (I) containing a blue sensitive silver halide as the silver halide and a yellow color image forming substance as the color image forming substance, the microcapsule (II) containing an infrared sensitive silver halide as the silver halide and a yellow color image forming substance as the color image forming substance, the microcapsule (III) containing a green sensitive silver halide as the silver halide and a magenta color image forming substance as the color image forming substance, and the microcapsule (IV) containing a red sensitive silver halide as the silver halide and a cyan color image forming substance as the color image forming substance, the light-sensitive material can give a natural color image according to a known subtractive color process in a system employing the microcapsules (I), (III) and (IV), and can give a false color image in a system employing the microcapsules (II), (III) and (IV).

Further, when a microcapsule (V) which contains a black color image forming substance is employed in addition to the above microcapsules (I), (II), (III) and (IV), the light-sensitive material can form an image improved within the area which should have a clear clack color, such as a character. This improvement of the black area is possible with the light-sensitive material employing microcapsules, because the interaction and transference of components between the neighboring image elements are restricted by the microcapsule. In the case that a gray color is unblanced in the image formation employing the microcapsules (I), (II), (III) and (IV), the gray color can be corrected by the microcapsules (V) containing a clack color image forming substance composed of two or more substances.

In the case that the polymerizable compound within the area where the latent image has been formed is polymerized, the sensitivity of the silver halide in the microcapsule (V) is preferably higher than that in other microcapsules. On the other hand, in the case that the polymerizable compound within the area where the latent image has not been formed is polymerized, the sensitivity of the silver halide in the microcapsule (V) is preferably lower than that in other microcapsules.

The light-sensitive material of the invention has various embodiments other than those mentioned above. The light-sensitive material can employ six of more kinds of microcapsules, and all of the microcapsules is not necessarily defined by the present invention.

The silver halide, the reducing agent, the polymerizable compound, the color image forming substance, the support and the microcapsule containing the silver halide, the polymerizable compound and the color image forming substance which constitute the light-sensitive material of the invention are described below. Thus composed material is referred hereinafter to as "light-sensitive material".

There is no specific limitation with respect to silver halide contained in the light-sensitive layer of the light-sensitive material. Examples of the silver halides include as silver chloride, silver bromide, silver iodide, silver chlorobromide, silver chloroiodide, silver iodobromide, and silver chloroiobromide in the form of grains.

The halogen composition of individual grains may be homogeneous or heterogeneous.

The silver halide grains ordinarily have a mean size of 0.001 to 10 μm, more preferably 0.001 to 5 μm.

The total silver content (including silver halide and an organic silver salt which is one of optional components) in the light-sensitive layer preferably is in the range of from 0.1 mg/m² to 10 g/m². The silver content of the silver halide in the light-sensitive layer preferably is not more than 0.1 g/m², more preferably in the range of from 1 mg to 90 mg/m².

Two or more kinds of silver halide grains which differ in halogen composition, crystal habit, grain size, and/or other features from each other can be used in combination.

There is no specific limitation on the crystal habit of silver halide grains. For example, a tubular grain having an aspect ratio of not less than 3 can be used.

There is no specific limitation on grain size distribution of silver halide grains. For example, the silver halide grains having such a grain size distribution that the coefficient of the variation is not more than 20% can be employed.

The reducing agent employed in the light-sensitive material has a function of reducing the silver halide and/or a function of accelerating or restraining a polymerization of the polymerizable compound. Examples of the reducing agent having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-diihydroxy-6-aminopyrimidines, reductiones, aminoreductones, o- or p-sulfonamidophenols, o- or p-sulfonamidonaphthols, 2-sulfonamidoindanones, 4-sulfonamido-5-pyrazolones, 3-sulfonamidoindoles, 4-sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291-334 (1977), Research Disclosure No. 17029, pp. 9-15 (June 1978), and Research Disclosure No. 17643, pp. 22-31 (December 1978). The reducing agents described in these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called super-additivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N, N-diethylamino)-phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4hexadecyloxy-5-t-octylphenol, 2-phenylsulfonylamino-4-t-butyl-5-hexadecyloxyphenol, 2-(N-butylcarbamoyl)-4-phenylsulfonylaminonapthol, 2-(N-methyl-N-octadecylcarbamoyl)-4-phenylsulfonylaminoaphtol, 1-acetyl-2-phenylhydrazine, 1-acetyl-2-(p- or o-aminophenyl)hydrazine, a-formyl-2-(p- or o-aminophenyl) hydrazine, 1-acetyl-2-(p- or o-methoxyphenyl)hydrazine, 1-lauroyl-2-(p- or o-aminophenyl)hydrazine, 1-trityl 2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)butyloyl}-2-(p- or o-aminophenyl)hydrazine, 1-{2-(2,5-di-t-pentylphenoxy)-butyloyl}-2-(p- or o-aminophenyl)hydrazine pentadecylfluorocaprylate salt, 3-indazolinone, 1-(3, 5-dichlorobenzoyl)-2-phenylhydrazine, 1-trityl-2-[{(2-N-butyl-Noctysulfamoyl)-4-methanesulfonyl}phenyl]hydrazine, 1-{4-(2, 5-di-tert-pentylphenoxy)butyloyl}-2-(p- or o methoxyphenyl)hydrazine, 1-(methoxycarbonylbenzohydryl)2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N, N-di-2-ethylhexyl]carbamoyl}phenyl]hydrazine, 1-(methocarbonylbenzohydryl)-2-(2,4-dichlorophenyl)hydrazine, 1-trityl-2-[{2-(N-ethyl N-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is not specific limitation with respect to the polymerizable compound, and any known polymerizable compound including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material are described in the above-mentioned and later-mentioned publications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acylamides, methacrylic acid, salts of methacrylic acid, methacrylic esters, methacrylamide, maleic anhydride, maleic esters, itaconic esters, styrene, styrene derivatives, vinyl esthers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexandiol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substance) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29-58 (pressure-sensitive copying paper), pp. 87-95 (azo-graphy), pp. 118-120 (heat-sensitive color formation by a chemical change) or in Mss. of the seminar promoted by the society of Kinki Chemical Industry, "The Newest Chemistry of Coloring Matter - Attractive Application and New Development as a Functional Coloring Matter", pp. 26-32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight and more preferably from 2 to 30 plarts by weight, per 100 parts by weight of the polymerizable compound. In the case that a developer is used, it preferably used in an amount of from about 0.3 to about 80 parts by weight per one part by weight of the color former.

The silver halide, the polymerizable compound and the color image forming substance are contained in microcapsules which are dispersed in the light-sensitive layer. The reducing agent and the other optional component can be contained in the microcapsules or arranged outside of the microcapsules in the light-sensitive layer. Generally, the reducing agent is preferably contained in the microcapsule, because of the reaction can progress smoothly in such case. The reducing agent is more preferably dispersed of dissolved in the core material of the microcapsules. In the case that a heat development is utilized in the use of the light-sensitive material, there is no problem in arranging the reducing agent outside of the microcapsules, because the reducing agent can permeate the microcapsule to reach the core material.

There is no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehyde resin, gelatin, epoxy resin, a complex resin containing polyamide resin and polyurea resin, a complex resin containing polyurethane resin and polyester resin.

The mean size of the microcapsule preferably ranges from 0.5 to 50 μm, more preferably 1 to 25 μm, most preferably 3 to 20 μm. The mean grain size of the silver halide preferably is not more than the 5th part of the mean size of the microcapsules, more preferably is not more than the 10th part. It is observed that when the mean sized of the microcapsules is not less than 5 times as much as the mean grain size of silver halide, even and uniform image can be obtained.

The light-sensitive material can be prepared by arranging a light-sensitive layer containing the above-mentioned components on a support. There is no limitation with respect to the support. In the case that heat development is utilized in the use of the light-sensitive material, material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610.

The light-sensitive layer can further contain optional components such as spectral sensitizing dyes, organic silver salts, various kinds of image formation accelerators, thermal polymerization inhibitors, thermal polymerization initiators, development stopping agents, fluorescent brightening agents, discoloration inhibitors, matting agents, antismudging agents, plasticizers, water releasers, binders, photo polymerization initiators and solvents of the polymerizable compound.

The spectral sensitivity of the silver halide is preferably varied by employing a spectral sensitizing dye. There is no specific limitation with respect to the sensitizing dye, and known sensitizing dyes used in the conventional art of photography may be employed in the light-sensitive material. Example of the sensitizing dyes is a methine dye (e.g., a cyanine dye, a merocyanine dye, a complex cyanine dye, a complex merocyanine dye, a holopolar cyanine dye, a hemicyanine dye, a styryl dye, a hemioxonol dye). These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity (i.e., supersensitizer) can be used. The amount of the sensitizing dye to be added generally ranges from about $10^{-8}$ to about $10^{-2}$ mol per 1 mol of silver halide. The spectral sensitizing dye is preferably adsorbed on the silver halide. Therefore, the dye is preferably added during the preparation of the silver halide emulsion (simultaneously with or after the grain formation).

Concrete examples of the sensitizing dye include the compounds having the following formulas (A) to (H), (J), (K) and (L).

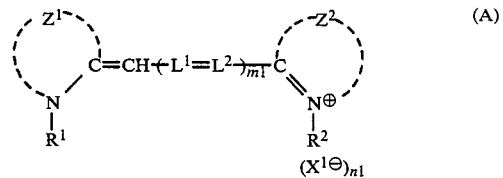
(A)

In the formula (A), each of $Z^1$ and $Z^2$ independently is an atomic group which forms a heterocyclic ring usually employed in a cyanine dye; such as thiazole ring, thazoline ring, benzothiazole ring, naphtothiazole ring, oxazole ring, oxazoline ring, benzooxazole ring, naphtooxazole ring, tetrazole ring, pyridine ring, quinoline ring, imidazoline ring, imidazole ring, benzimidazole ring, naphtoimidazole ring, selenazoline ring, selenazole ring, benoselenazole ring, naphatoselenazole and indolenine ring. These rings may be substituted with a lower alkyl group (e.g., a methyl group), a halogen atom, phenyl, hydroxyl, an alkoxy group (containing 1 to 4 carbon atoms), carboxyl, an alkylcarbonyl group, an alkylsulfamoyl group, an alkylcarbamoyl group, acetyl, acetoxy, cyano, trichrolomethyl, trifluoromethyl or nitro.

Each $L^1$ and $L^2$ independently is methine or a substituted methine group. Example of the substituted methine group is a methine group substituted with a lower alkyl group (e.g., methyl, ethyl), phenyl, a substituted phenyl group, methoxy and ethoxy.

Each of $R^1$ and $R^2$ independently is an alkyl group containing 1 to 5 carbon atoms, a substituted alkyl group or allyl. The substituted alkyl group is a group usually employed as an N-substituent group in a cyanine dye, such as an alkyl group substituted with carboxyl or sulfo. Examples of the alkyl group substituted with sulfo include γ-sulfopropyl, -sufobutyl, 2-(3-sulfopropoxy)-ethyl and 2-[2-(3-sulfopropoxy)ethoxy]ethyl and 2-hydrosulfopropyl.

In the formula (A), "m1" is 0, 1 or 2. $X^{1\ominus}$ is an anion acid employed in a cyanine dye, such as iodide ion, bromide ion, p-toluensulfonic ion and perchlorate ion. "n1" is 0 or 1. When the compound having the formula (A) has a betaine structure, "n1" is 0.

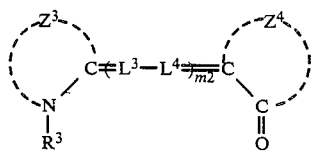

In the formula (B), $Z^3$ is an atomic group which forms a heteracyclic ring usually employed in a cyanine dye. Examples of the heterocyclic are the same as those described in the formula (A).

$Z^4$ is an atomic group which forms a ketoheterocyclic ring usually employed in a merocyanine dye. Examples of the ketoheterocyclic ring include rhodine, thiohydantoin, oxyindole, 2-thiooxazolidinedione and 1,3-indane-dion. $L^3$ and $L^4$ have the same meanings as for $L^1$ and $L^2$. $R^3$ has the same meaning as for $R^1$ or $R^2$. "m2" is 1, 2, 3 or 4.

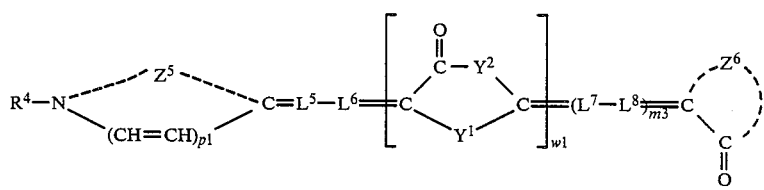

In the formula (C), $Z^5$ is an atomic group which forms a heterocyclic ring, such as 4-quinoline ring, 2-quinoline ring, benzothiazole ring, benzoxazole ring, naphtothiazole ring, naphtoselenazole ring and indolenine ring. "p1" is 0 or 1. $R^4$ has the same meanings as for $R^1$ or $R^2$. $L^5$ and $L^6$ have the same meanings as for $L^3$ and $L^4$. "m3" is 0 or 2. $L^7$ and $L^8$ have the same meanings as for $L^1$ and $L^2$. $Z^6$ has the same meanings as for $Z^4$. Each of $Y^1$ and $Y^2$ independently is oxygen, sulphur, selenium or $=N-R^5$ ($R^5$ is alkyl group or allyl group which contains 1 to 8 carbon atoms, such as methyl, ethyl and propyl), and at least one of them is $=N-R^5$. "w1" is 1 or 2.

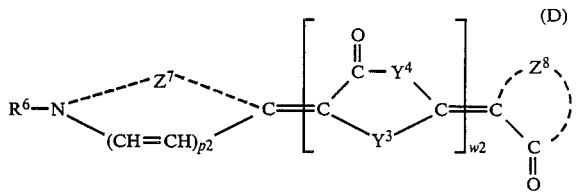

In the formula (D), $Z^7$ and $Z^8$ have the same meanings as for $Z^5$ and $Z^6$. $R^6$ has the same meaning as for $R^1$ or $R^2$. "p2" is 0 or 1. $Y^3$ and $Y^4$ have the same meanings as for $Y^1$ and $Y^2$. "w2" is 1 or 2.

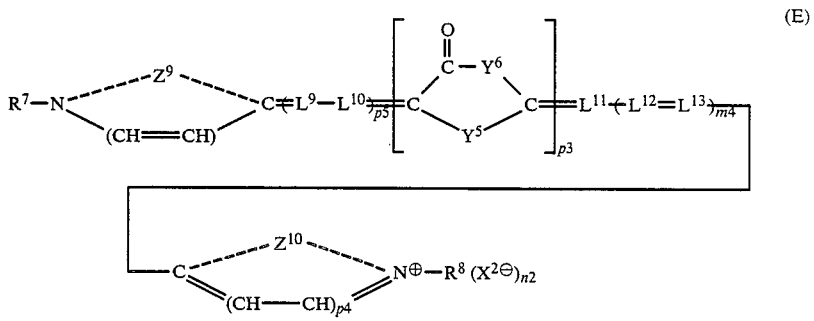

In the formula (E), $R^7$ and $R^3$ have the same meanings as for $R^1$. $Z^9$ and $Z^{10}$ have the same meanings as for $Z^5$. Each of "p3" and "p4" independently is 0 or 1. $L^9$, $L^{10}$, $L^{11}$, $L^{12}$ and $L^{13}$ have the same meanings as for $L^1$. $X^2$ has the same meanings as for $X^1$. "n2" is 0 or 1. When the compound having the formula (A) has a betain structure, "n2" is 0. $Y^5$ and $Y^6$ have the same meanings as for $Y^1$. Each of "p5" and "m4" independently is 0 or 1. "w3" is 1 or 2.

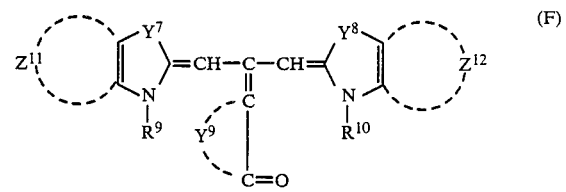

In the formula (F), each of $Z^{11}$ and $Z^{12}$ independently is an atomic group which forms benzene ring, a substituted benzene ring or naphtalene ring. Examples of the substituted benzene ring are those substituted with a lower alkyl group (e.g., methyl group), a halogen atom, phenyl, hydroxyl, an alkoxy group which contains 1 to 4 carbon atoms, carboxyl, an alkoxycarbonyl group, an alkylsulfamoyl group, an alkylcarbamoyl group, acetyl, cyano, trichrolomethyl, trifluoromethyl or nitro. $R^9$ and $R^{10}$ have the same as for $R^1$. Each of $Y^7$ and $Y^8$ independently is oxygen, sulphur, selenium, $=CR^{11}R^{12}$ (each of $R^{11}$ and $R^{12}$ independently is methyl or ethyl), $=N-R^{13}$ ($R^{13}$ is an alkyl group, allyl or a substituted alkyl group which is usually employed as an N-substituted group in a cyanine dye), or $-CH=CH-$. $Y^9$ is an atomic group which forms a 5- or 6- membered heterocyclic ring.

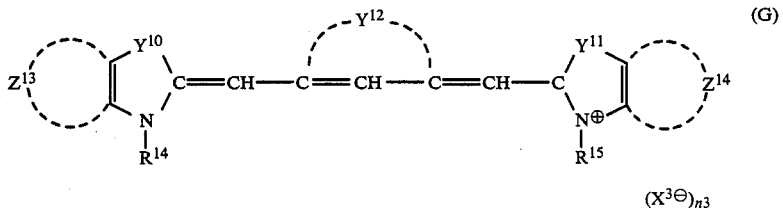

In the formula (G), $Z^{13}$ and $Z^{14}$ have the same meanings as for $Z^{11}$. $R^{14}$ and $R^{15}$ have the same meanings as for $R^1$. $Y^{10}$ and $Y^{11}$ have the same meanings as for $Y^7$. $Y^{12}$ is an atomic group which forms a 5- or 6-membered hydrocarbon ring. $X^3$ has the same meaning as for $X^1$. "n3" is 0 or 1. When the compound having the formula (G) has a betain structure, "n3" is 0.

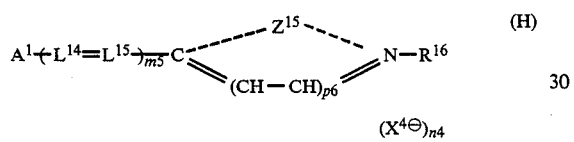

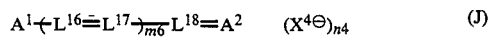

In the formulas (H) and (J), $X^4$ has the same meanings as for $X^1$. "n4" is 0 or 1. When the compound having the formula (H) or (J) has a betain structure, "n4" is 1. "p6" is 0 or 1. "m5" is 1 or 2. "m6" is 0 or 1. $L^{14}$, $L^{15}$, $L^{16}$, $L^{17}$ and $L^{18}$ have the same meanings as for $L^1$. $Z^{15}$ have the same meanings as for $Z^1$. "p6" is 0 or 1.

$A^1$ is a group described below.

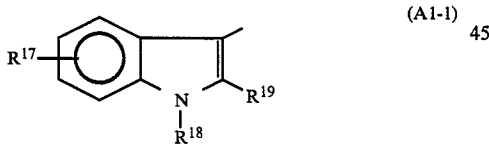

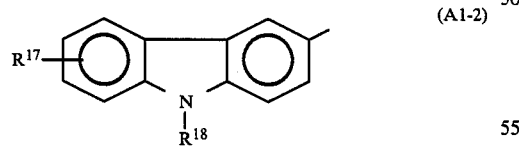

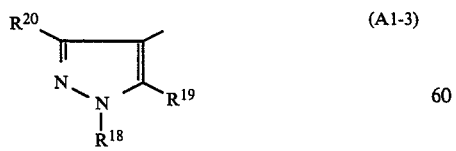

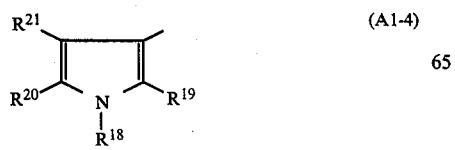

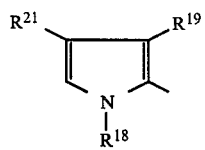

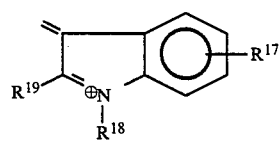

$A^2$ is a group described below.

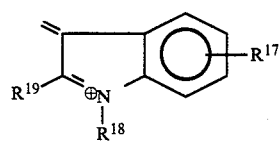

(A2-1)

(A2-2)

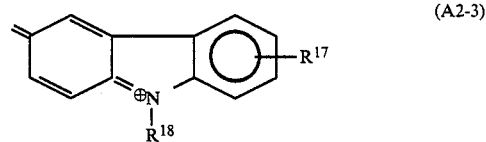

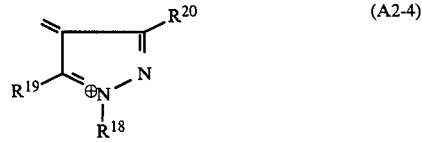

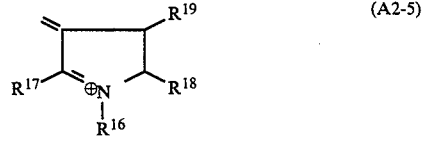

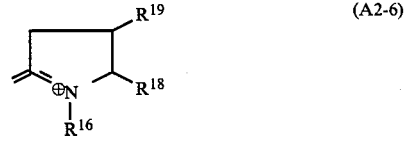

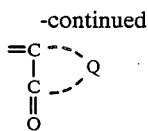

In the formulas (A1) and (A2), each of $R^{16}$ and $R^{18}$ independently is hydrogen, an alkyl group, a substituted alkyl group or an aryl group. $R^{17}$ is a halogen atom, nitro, a lower alkyl group, an alkoxy group, an alkoxycarbonyl group, an alkoxysulfonyl group or an arylsulfonyl group.

Each of $R^{19}$, $R^{20}$ and $R^{21}$ independently is hydrogen, a halogen atom, an alkyl group, a cycloalkyl group, an aryl group, a pyridine group, carboxyl or an alkoxycarbonyl group. Q is an atomic group which forms a 5- or 6-membered heterocyclic ring, such as rhodanine, 2-thiooxazolidinedione, 2-thiohydantoin and barbituric acid.

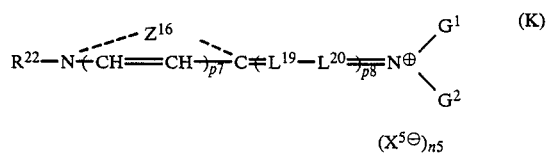

In the formula (K), $R^{22}$ have the same meanings as for $R^1$. $Z^{16}$ has the same meanings as for $Z^1$. $L^{19}$ and $L^{20}$ have the same meanings as for $L^1$. "p7" is 0 or 1. "p8" is 1, 2 or 3.

Each of $G^1$ and $G^2$ independently has the same meaning as for $R^1$, or $G^1$ and $G^2$ form a secondary cyclic amine (e.g., pyrrolidone, 3-pyrroline, piperidine, piperazine, morpholine, 1,2,3,4-tetrahydroquinoline, decahydroquinoline, 3-azabicyclo[3,2,2]nonane, indoline, azetine and hexahydroazepine). $X^5$ has the same meanings as for $X^1$. "n5" is 0 or 1. When the compound having the formula (K) has a betain structure, "n5" is 0.

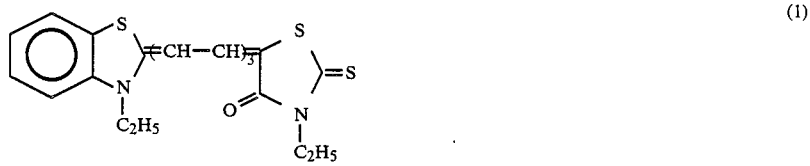

In the formula (L), $Z^{17}$ has the same meaning as for $Z^4$. $L^{21}$, $L^{22}$ and $L^{23}$ have the same meanings as for $L^1$. $G^3$ and $G^4$ have the same meanings as for $G^1$. "p9" is 0, 1, 2 or 3.

Examples of an infrared sensitizing dye are described below. These infrared sensitizing dyes are also described in Japanese Patent Provisional Publication Nos. 60(1985)-196757 and 61(1986)-65232.

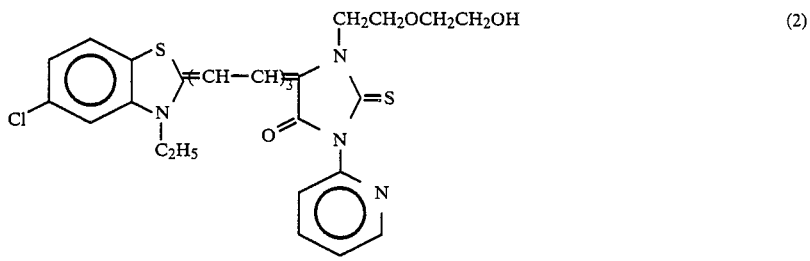

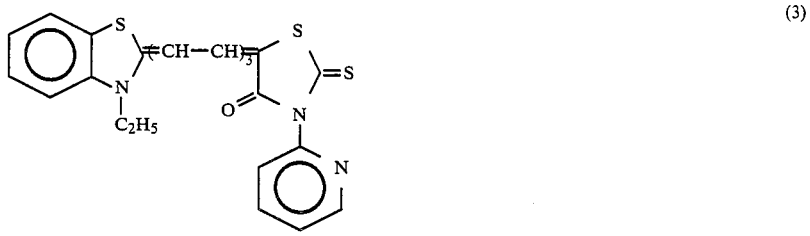

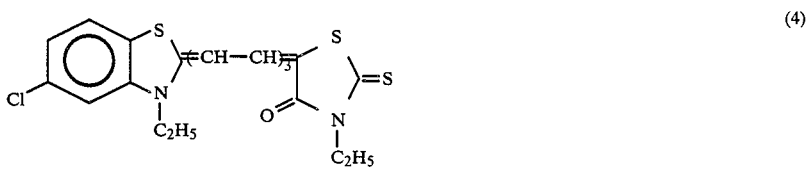

-continued
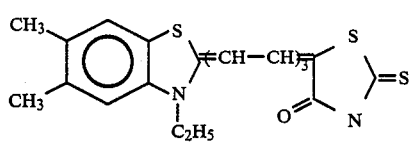 (5)
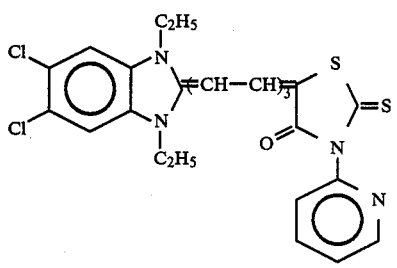 (6)
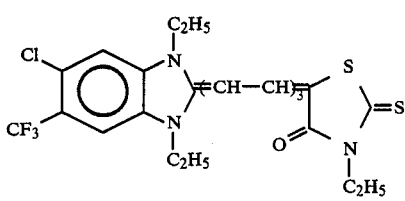 (7)
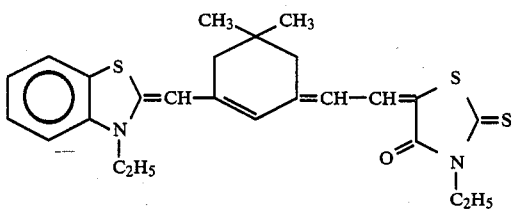 (8)
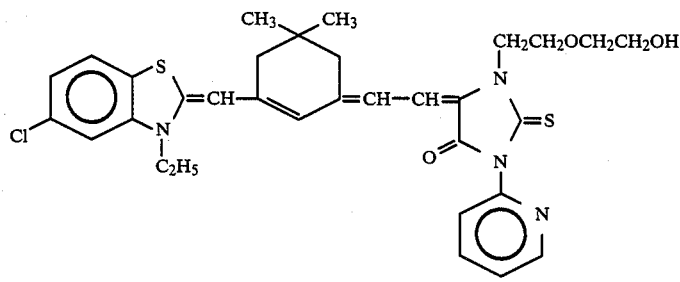 (9)
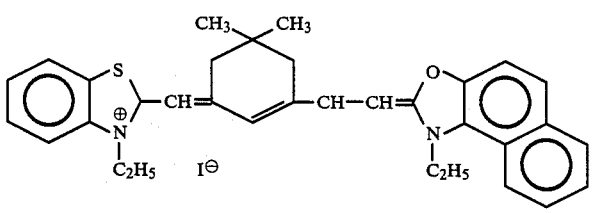 (10)
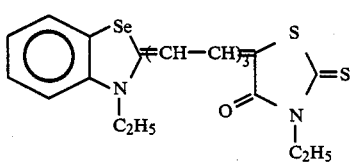 (11)

-continued
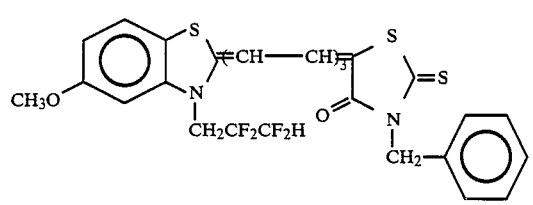 (12)
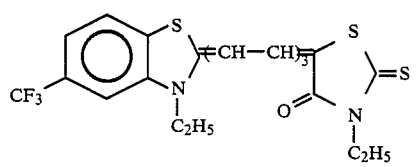 (13)
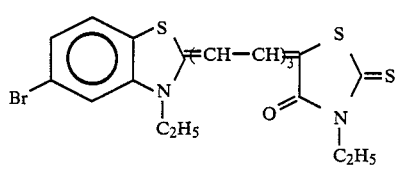 (14)
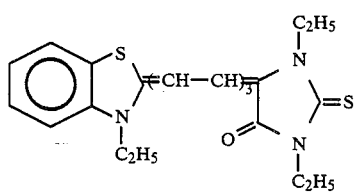 (15)
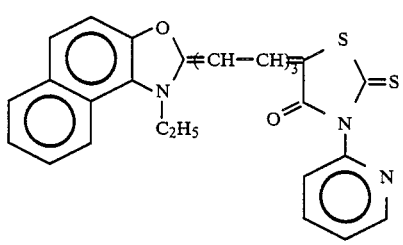 (16)
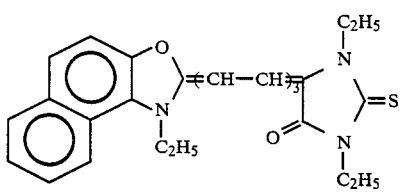 (17)
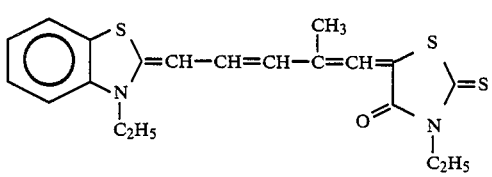 (18)

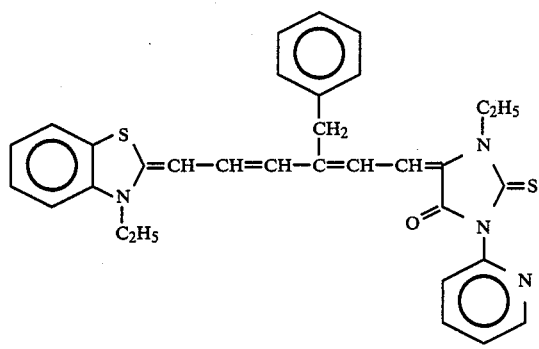
(19)
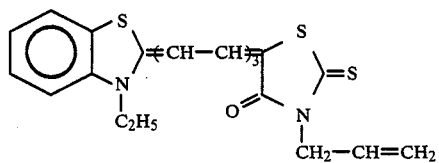
(20)
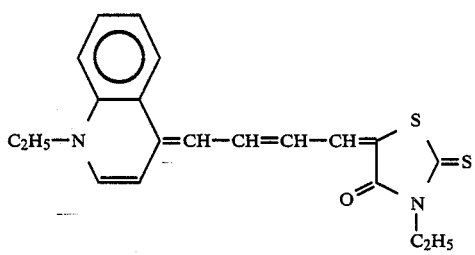
(21)
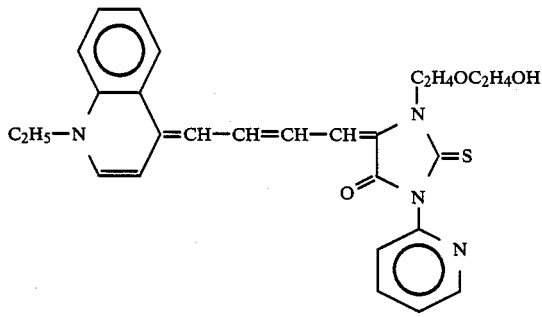
(22)
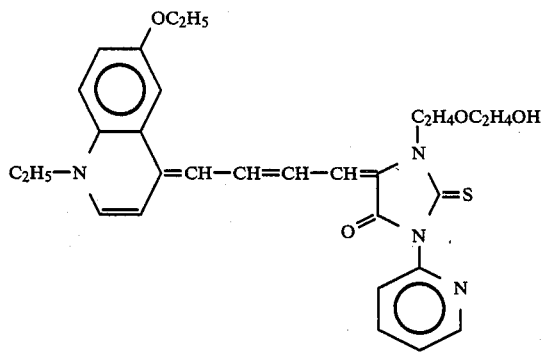
(23)

-continued
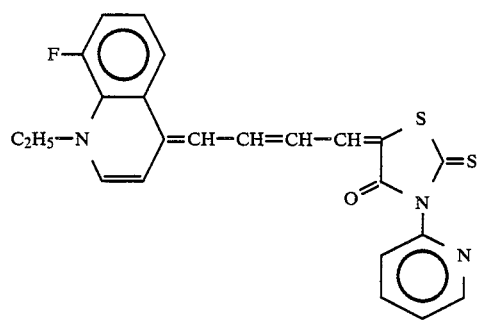
(24)
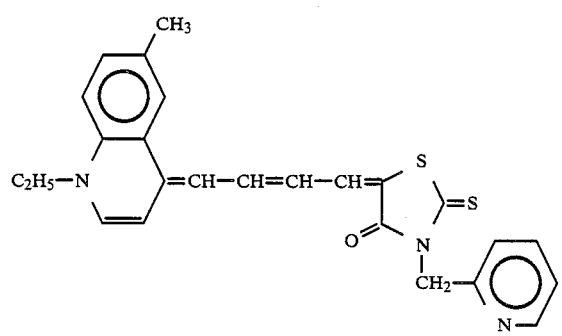
(25)
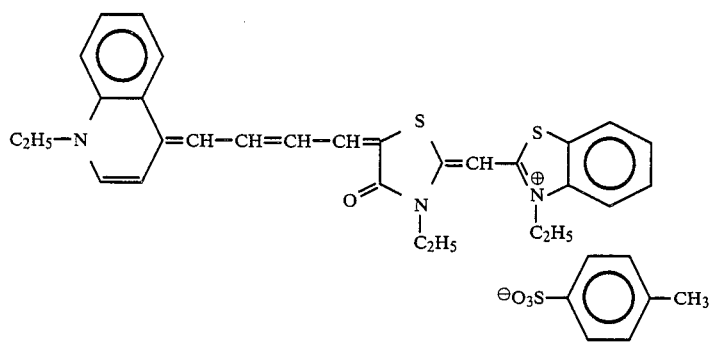
(26)
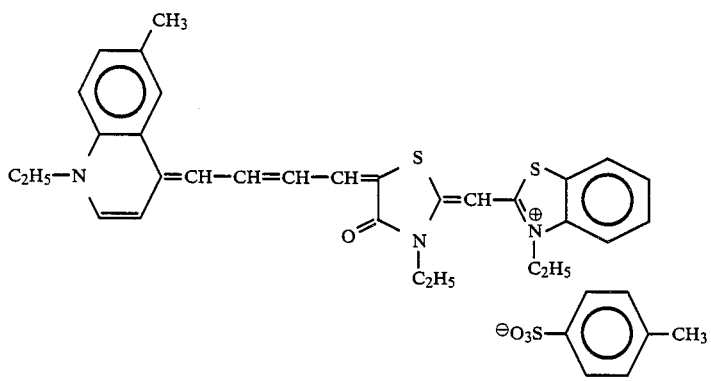
(27)

(28)
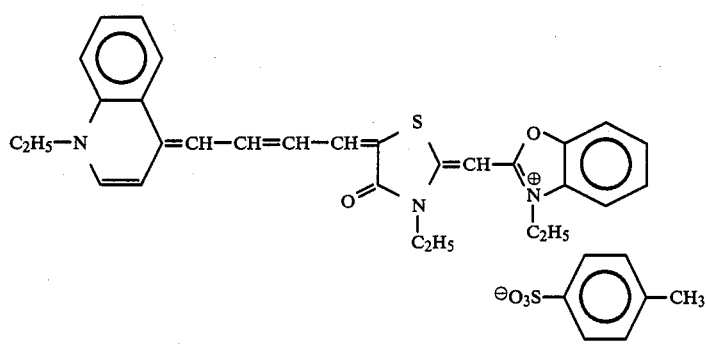
(29)
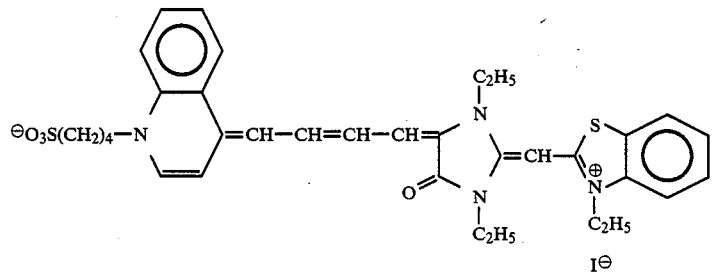
(30)
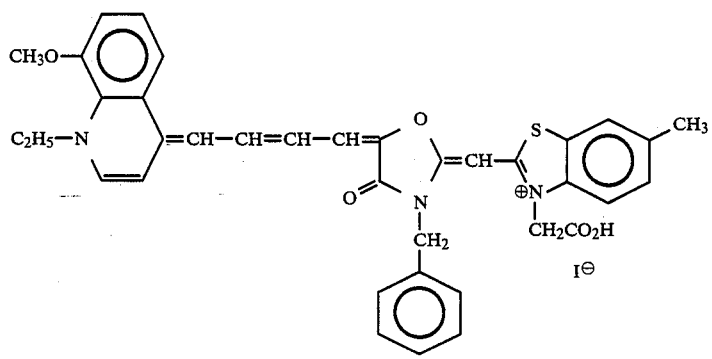
(31)
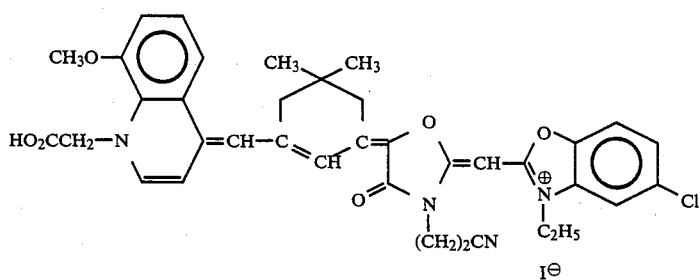
(32)
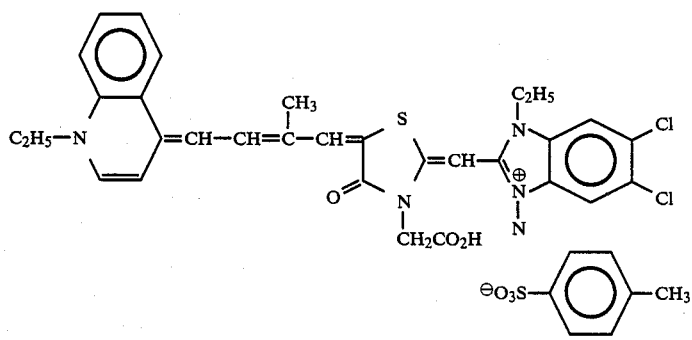

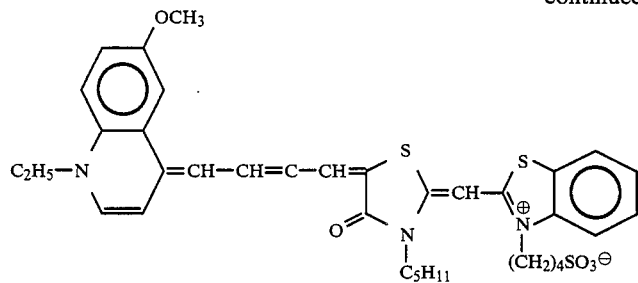
(33)

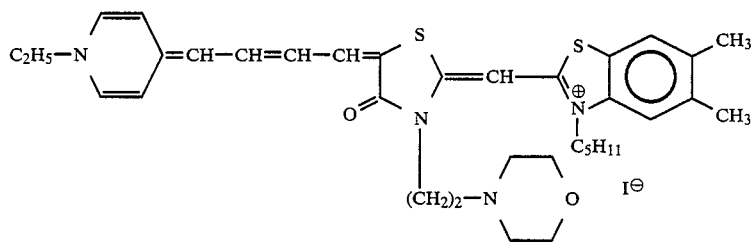
(34)

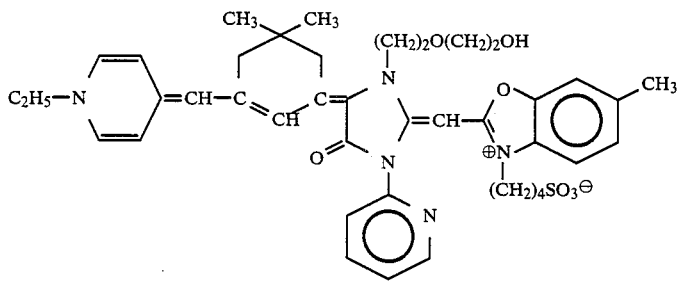
(35)

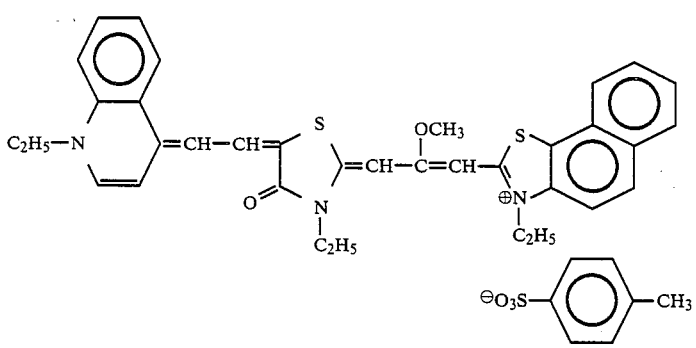
(36)

Examples of a supersensitizer include an aminostyryl compound substituted with a nitrogen-containing heterocyclic group (described in U.S. Pat. Nos. 2,933,390 and 3,635,721), an aromatic organic acid-formaldehyde condensate (described in U.S. Pat. No. 3,743,510), a cadmium sasalt an azaindene compound. A combination of a spectral sensitizing dye and a supersensitizer is described in U.S. Pat. Nos. 3,615,613, 3,615,641, 3,617,295 and 3,635,721.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzeotriazoles are most preferable. The organic silver salt is preferably used in an amount of from 0.01 to 10 mole, and preferably from 0.01 to 1 mole, per 1 mole of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, compounds functioning as an anti-fogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolates and metaborates of alkali metals or alkaline earth metal; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases of base precursors are preferably used in an amount of not more than 100% by weight, and more preferably from 0.1 to 40% by weight, based on the total solid content of the light-sensitive layer. These bases or base precursors can be used singly or in combination.

In the light-sensitive material, the silver halide, the reducing agent, the polymerizable compound and the color image forming substance are preferably contained in microcapsules and the base or base precursor is preferably arranged outside of the microcapsule in the light-sensitive layer. Further, the base or base precursor can be contained in different microcapsules from those containing the polymerizable compound. The base or base precursor can be contained in the microcapsules under a condition that the base or base precursor is dissolved or dispersed in an aqueous solution of a water retention agent, or under a condition that the base or base precursor is adsorbed on solid particles. Furthermore, the base or base precursor can be contained in a layer different from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and bisphenyl suberate described in Research Disclosure 26–28 (December 1976). The light-sensitive material employing the hot-melt solvents is described in Japanese patent application No. 60(1985)-227527. The hot-melt solvent is preferably used in an amount of from 0.5 to 50% by weight, and more preferably from 1 to 20 % by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanacarbonitrile), dimethyl 2, 2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the concentration in the layer to thereby stop development, or compounds that mutually react with silver or a silver salt to suppress development. More specifically, examples of the development stopping agents include acid precursors capable of releasing acid upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)230133. Examples of the electrophilic compounds which induce substitution reaction with bases upon heating are described in Japanese Patent Provisional Publication No. 60(1985)-230134.

The antismudging agent employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 μm, more preferably 5 to 40 μm. The size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

A photo polymerization initiator can be contained in the light-sensitizer layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, pp. 9-15 (June 1978).

Examples of auxiliary layers which are optionally arranged on the light-sensitive material include an image-receiving layer, a heating layer, an antistatic layer, an anticurl layer, a release layer, a cover sheet or a protective layer, a layer containing a base or base precursor and a base barrier layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in a aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulphur sensitization, reduction sensitization or noble metal sensitization, or a combination thereof that are known for emulsions for the preparation of the conventional light-sensitive materials.

When a spectral sensitizing dye is added to the silver halide emulsion, the sensitizing dye is preferably added during the preparation of the emulsion. The sensitizing dye is preferably dissolved in an adequate solvent prior to the addition to the silver halide emulsion. Examples of the solvent include a water-miscible organic solvent (e.g., methanol, ethanol, propanol, a fluorinated alcohol methyl cellosolve, dimethylformamide and acetone) and water which may be alkaline or acid. These solvents can be used singly or in combination. Alternatively, the sensitizing dye can be used in the form of a dispersion in a medium of water/gelatin or in the form of a powder prepared by using a surface active agent.

When the organic silver salt are contained in the light-sensitive layer, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide (including the silver halide emulsion), the reducing agent or the color image forming substance can be dissolved, emulsified or dispersed in the polymerizable compound to prepare the light-sensitive material. Especially, the color image forming substance is preferably incorporated in the polymerzable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can also be prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

The light-sensitive composition is preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials (described in U.S. Pat. Nos. 2,800,457 and 2,800,458), an interfacial polymerization process (described in U.S. Pat. No. 3,287,154, U.K. Pat. No. 990,443 and Japanese Patent Publication Nos. 38(1963)-19574, 42(1967)-446 and 42(1967)-771), a process utilizing precipitation of polymers (described in U.S. Pat. Nos. 3,418,250 and 3,660,304), a process of using isocyanate-polyol wall materials (described in U.S. Pat. No. 3,796,669), a process of using isocyanate wall materials (described in U.S. Pat. No. 3,914,511), a process of using urea-formaldehyde or urea-formaldehyde-resorcinol wall forming materials (described in U.S. Pat. Nos. 4,001,140, 4,087,376 and 4,089,802), a process of using melamine-formaldehyde resins hydroxypropyl cellulose or like wall-forming materials (described in U.S. Pat. No. 4,025,455), an in situ process utilizing polymerization of monomers (described in U.K. Pat. No. 867,797 and U.S. Pat. No. 4,001,140), an electrolytic dispersion and cooling process (described in U.K. Pat. Nos. 952,807 and 965,074), a spray-drying process (described in U.S. Pat. No. 3,111,407 and U.K. Pat. No. 930,422), and the like. It is preferable, though not limitative, that the microcapsule is prepared by emulsifying core materials containing the polymerizable compound and forming a polymeric membrane (i.e., shell) over the core materials.

In the above-mentioned process, an aqueous dispersion of the microcapsules can be obtained. The dispersion of the three or more kinds of the microcapsules each of which follows the present invention can be used as the coating solution of the light-sensitive material. The other components can be added to the coating solution in a similar manner as the emulsion of the polymerizable compound.

A light-sensitive material of the invention can be prepared by coating and drying the above-prepared coating solution on a support in the conventional manner.

The use of the light-sensitive material of the invention is described below.

In the use of the light-sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

In the case that the polymerizable compound within the area where the latent image of the silver halide has been formed is polymerized, prior to a development process, the light-sensitive material of the invention is preferably irradiated with a light which has a spectrum corresponding to the spectral sensitivity of a microcapsule which is unnecessary for a system. For example, when a light-sensitive material is used for a natural color system, the material is preferably irradiated with an infrared ray. On the other hand, the light-sensitive material is used for a false color system, the material is preferably irradiated with a blue light.

In the case that the polymerizable compound within the area where the latent image of the silver halide has not been formed is polymerized, the light-sensitive material of the invention is imagewise exposed to light preferably filtering a light which has a spectrum corresponding to the spectral sensitivity of a microcapsule which is unnecessary for a system. For example, when a light-sensitive material is used for a natural color system, the material is imagewise exposed to light preferably filtering an infrared ray. On the other hand, the light-sensitive material is used for a false color system, the material is imagewise exposed to light preferably filtering a blue light.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Provisional Publication No. 61(1986)-294434. Further, the light-sensitive material can be heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

A color image can be formed on the light-sensitive material in which the light-sensitive layer contains a color former and a developer as the color image forming substances, one of them is together with the polymerizable compound contained in a microcapsule, and the other is arranged outside of the microcapsule.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include baryta paper in addition to various examples which can be employed as the support of the following light-sensitive material. In the case that a porous material, such as paper is used as the support of the image-receiving material, the porous support preferably has such a surface characteristic that a filtered maximum waviness of not less than 4 $\mu$m is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system. In the case that a dye or pigment is employed as the color image forming substance, the image-receiving material can be composed of a simple support.

For example, when a color formation system using a color former and developer is employed, the developer can be contained in the image-receiving layer. Further, the image-receiving layer can be composed of at least one layer containing a mordant. The mordant can be selected from the compound known in the art of the conventional photography according to the kind of the color image forming substance. If desired, the image-receiving layer can be composed of two or more layers containing two or more mordant different in the mordanting power form each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$·cm/cm$^2$·sec·cmHg can be used as the binder to protect the color of the image formed on the image-receiving material.

The image-receiving layer can contain a granulated thermoplastic compound to obtain a glossy image. Further, the image-receiving layer can contain a white pigment (e.g., titanium dioxide) to function as a white reflection layer. Furthermore, a photo polymerization initiator or a thermalpolymerization initiator can be contained in the image-receiving layer to polymerize the unpolymerized polymerizable compound.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer.

In the development process, the color image forming substance is fixed by polymerization of the polymerizable compound. Then, pressing the light-sensitive material on the image-receiving material to transfer the color image forming substance in unfixed area, a color image can be produced on the image-receiving material. The process for pressing can be carried out in various known manners.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of silver halide emulsion

In 1,000 ml of water were dissolved 20 g of gelatin and 1 g of potassium bromide, and the resulting gelatin solution was adjusted to a pH of 3.8 using 1N sulfuric acid and kept at 70° C. To the gelatin solution, 600 ml of an aqueous solution containing 70 g of potassium bromide and 600 ml or an aqueous solution containing 0.59 mole of silver nitrate were added simultaneously at the same feed rate over a period of 50 minutes. After 5 minutes, to the mixture, 100 ml of aqueous solution containing 3.9 g of potassium iodide and 10 ml of an aqueous solution containing 0.01 mole of silver nitrate were added simultaneously at the same feed rate over a period of 5 minutes. Thus, a silver iodobromide emulsion having tetradecahedral grains, uniform grain size distribution and a mean grain size of 0.25 μm was obtained.

The emulsion was washed for desalting, and to the emulsion was added 82 ml of 1% methanol solution of the following sensitizing dye (a) to obtain a silver halide emulsion (A). The yield of the emulsion was 600 g.

(Sensitizing dye (a))

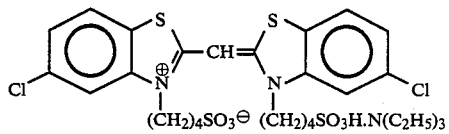

Preparation of silver benzotriazole emulsion

In 3,000 ml or water were dissolved 28 g of gelatin and 20 g of benzotriazole, and the solution was kept at 40° C. while stirring. To the solution was added 100 ml of an aqueous solution of 17 g of silver nitrate over 2 minutes. Excessive salts were sedimented and removed from the resulting emulsion by pH-adjustment. Thereafter, the emulsion was adjusted to pH 7.0 to obtain a silver benzotriazole emulsion. The yield of the emulsion was 400 g.

Preparation of light-sensitive composition

In 100 g of trimethylolpropane triacrylate were dissolved 0.1 g of the following copolymer, 13 g of the following (yellow) color image forming substance (a) and 0.5 g of Emulex NP-8 (tradename of Nippon Emulsion Co., Ltd.).

(Copolymer)

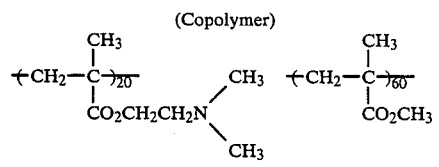

(Color image forming substance (a))

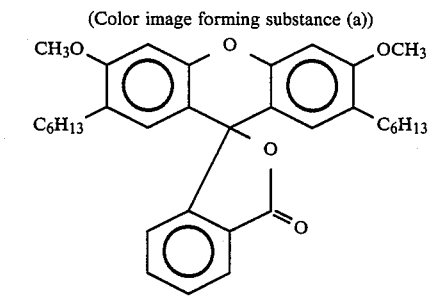

In 18 g of the resulting solution were dissolved 0.3 g of the following reducing agent (I) and 0.8 g of the following reducing agent (II).

(Reducing agent (I))

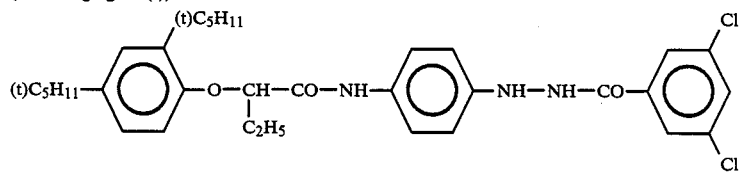

(Reducing agent (II))

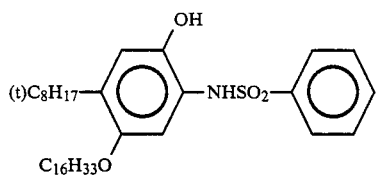

Further, to the solution were added 1 g of the silver halide emulsion (A) and 0.2 g of the silver benzotriazole emulsion, and the resulting mixture was stirred at 15,000 r.p.m. for 10 minutes to obtain a light-sensitive composition (A).

Preparation of light-sensitive microcapsule

To 9.0 g of 20% aqueous solution of Isobam (tradename of Kuraray Co., Ltd.) was added 50 g of 2.5% aqueous solution of pectin. After the solution was adjusted to a pH of 4.0 using 10% sulfuric acid, the light-sensitive composition (A) was added to the resulting solution, and the mixture was stirred at 7,000 r.p.m. for 2 minutes to emulsify the light-sensitive composition in the aqueous medium.

To 70 g of the aqueous emulsion were added 8.0 g of 40% aqueous solution of urea, 3.0 g of 10% aqueous solution of resorcinol, 8.0 g of 37% aqueous solution of formaldehyde, and 3.0 g of 8% aqueous solution of ammonium sulfate in order, and the mixture was heated at 60° C. for 2 hours while stirring. After the mixture was ajuted to a pH of 7.0 using 10% aqueous solution of sodium hydroxide, to the mixture was added 4.0 g of 30% aqueous solution of sodium hydrogen sulfite to obtain a dispersion containing light-sensitive micocapsules (A).

Preparation of silver halide emulsion

In 1,500 ml or water were dissolved 16 g of gelatin and 0.5 g of sodium chloride, and the resulting gelatin solution was adjusted to a pH of 3.8 using 1N sulfuric acid and kept at 60° C. To the gelatin solution, 300 ml of an aqueous solution containing 71 g of potassium bromide and 300 ml of an aqueous solution containing 0.59 mole of silver nitrate were added simultaneously at the same feed rate over a period of 50 minutes. After 10 minutes, to the mixture, 100 ml of aqueous solution containing 2.9 g of potassium iodide was added simultaneously at the same feed rate over a period of 5 minutes. Thus, a silver iodobromide emulsion having a tetradecahedral grains, uniform grain size distribution and a mean grain size of 0.22 μm was obtained.

The emulsion was washed for desalting, and to the emulsion was added 50 ml of 1% methanol solution of the following sensitizing dye (b) to obtain a silver halide emulsion (B). The yield of the emulsion was 600 g.

Preparation of light-sensitive composition

A light-sensitive composition (B) was prepared in the same manner as in the preparation of the light-sensitive composition (A), except that 0.85 g of the silver halide emulsion (B) was used in place of 1 g of the silver halide emulsion (A) and 10 g of the following (magenta) color image forming substance (b) was used in place of 13 g of the color image forming substance (a).

(Color image forming substance (b))

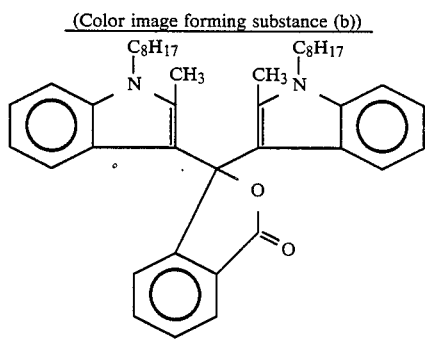

Preparation of light-sensitive microcapsule

A dispersion containing light-sensitive microcapsules (B) was prepared in the same manner as in the preparation of the light-sensitive microcapsules (A), except that the light-sensitive composition (B) was used in place of the light-sensitive composition (A).

Preparation of silver halide emulsion

A silver halide emulsion (C) was prepared in the same manner as in the preparation of the silver halide emulsion (B), except that 47 ml of 1% methanol solution of the following sensitizing dye (c) was used in place of the 50 ml of 1% methanol solution of the sensitizing dye (b).

(Sensitizing dye (b))

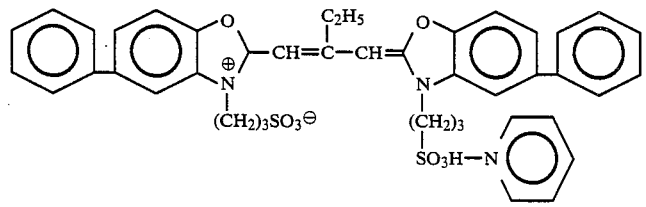

(Sensitizing dye (c))

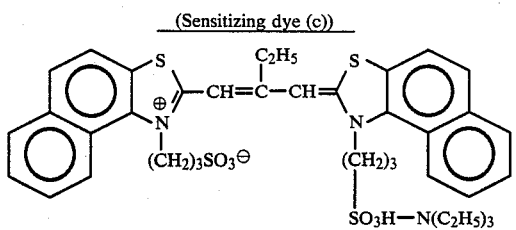

Preparation of light-sensitive composition

A light-sensitive composition (C) was prepared in the same manner as in the preparation of the light-sensitive composition (A), except that 0.85 g of the silver halide emulsion (C) was used in place of 1.0 g of the silver halide emulsion (A) and 12 g of the following (cyan) color image forming substance (c) was used in place of 13 g of the color image forming substance (a).

(Color image forming substance (c))

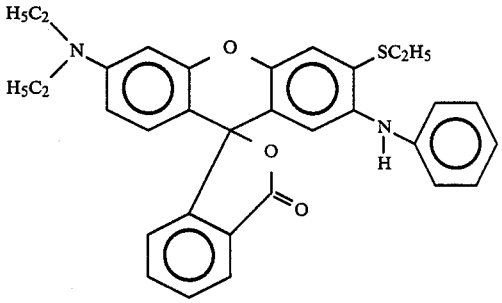

Preparation of light-sensitive microcapsule

A dispersion containing light-sensitive microcapsules (C) was prepared in the same manner as in the preparation of the light-sensitive microcapsule (A), except that the light-sensitive composition (C) was used in place of the light-sensitive composition (A).

Preparation of silver halide emulsion

In 1,500 ml of water were dissolved 14 g of gelatin and 2.0 g of sodium chloride, and the resulting gelatin solution was adjusted to a pH of 3.8 using 1N sulfuric acid and was kept at 75° C. To the gelatin solution, 1,000 ml of an aqueous solution containing 70 g of potassium bromide and 1,000 ml of an aqueous solution containing 0.59 mole of silver nitrate were added simultaneously at the same feed rate over a period of 50 minutes. After 2 minutes, to the mixture, 100 ml of aqueous solution containing 5.9 g of potassium iodide was added simultaneously at the same feed rate over a period of 10 minutes. Thus, a silver iodobromide emulsion having a tetradecahedral grains, uniform grain size distribution and a mean grain size of 0.28 μm was obtained.

The emulsion was washed for desalting, and to the emulsion were added 57 ml of 1% methanol solution of the sensitizing dye (a), 35 ml of 1% methanol solution of the sensitizing dye (b) and 33 ml of 1% methanol solution of the sensitizing dye (c) to obtain a silver halide emulsion (D). The yield of the emulsion was 600 g.

Preparation of light-sensitive composition

In 100 g of trimethylolpropane triacrylate were dissolved 0.2 g of the following copolymer, 10 g of following (black) color image forming substance (d) and 0.3 g of Emulex NP-8 (tradename of Nippon Emulsion Co., Ltd.).

(Copolymer)

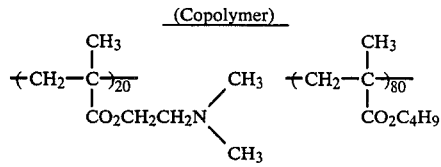

(Color image forming substance (d))

In 18 g of the resulting solution were dissolved 0.5 g of the reducing agent (I) and 0.8 g of the reducing agent (II).

Further, to the resulting solution were added 1.2 g of the silver halide emulsion (D) and 0.1 g of the silver benzotriazole emulsion, and the mixture was stirred at 15,000 r.p.m. for 10 minutes to obtain a light-sensitive composition (D).

Preparation of light-sensitive microcapsule

A dispersion containing light-sensitive microcapsules (D) was prepared in the same manner as in the preparation of the light-sensitive microcapsules (A), except that the light-sensitive composition (D) was used in place of the light-sensitive composition (A).

Preparation of silver halide emulsion

A silver halide emulsion (E) was prepared in the same manner as in the preparation of the silver halide emulsion (B), except that 98 ml of 0.5% methanol solution of the following infrared sensitizing dye (1) was used in place of 50 ml of 1% methanol solution of the sensitizing dye (b).

(Infrared sensitizing dye (1))

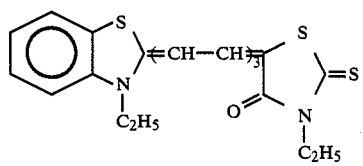

Preparation of light-sensitive composition

A light-sensitive composition (E) was prepared in the same manner as in the preparation of the light-sensitive composition (A), except that the silver halide emulsion (E) was used in place of the silver halide emulsion (A).

Preparation of light-sensitive microcapsule

A dispersion containing light-sensitive microcapsules (E) was prepared in the same manner as in the preparation of the light-sensitive microcapsules (A), except that the light-sensitive composition (E) was used.

respectively used in place of the infrared sensitzing dye (1). Each of the amounts is set forth in Table 1.

(Infrared sensitizing dye (2))

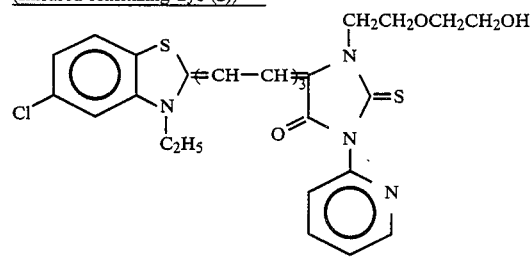

(Infrared sensitizing dye (10))

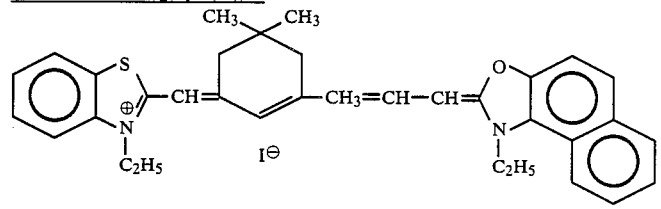

(Infrared sensitizing dye (36))

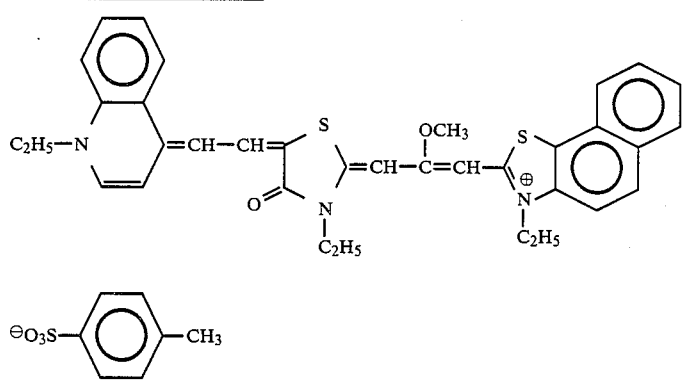

Preparation of light-sensitive material

To the mixture of 3.5 g of the microcapsule dispersion (A), 2.5 g of the microcapsule dispersion (B), 3.0 g of the microcapsule dispersion (D) and 3.5 g of the aqueous solution of the following anionic surfactant and 5.0 g of 10% aqueous solution of guanidine trichloroacetate (water/ethanol=80/20 volume ratio) to prepare a coating solution. The coating solution was coated on a cast-coated paper (produced by Sanyo Pulp Co., Ltd.) having a basis weight of 65 g/m² to give a layer having a weight of 35g/m² and dried at 40° C. to obtain a light-sensitive material (I).

(Anionic surfactant)

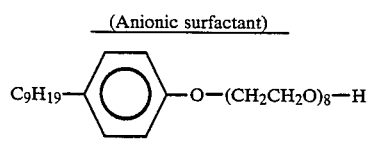

Example 2

Preparation of silver halide emulsion

Each of the silver halide emulsions (F) to (H) was prepared in the same manner as in the preparation of the silver halide emulsion (E), except that each of the following infrared sensitizing dyes (2), (10) and (36) was

TABLE 1

| Silver Halide Emulsion | Infrared Sensitizing Dye | Amount (0.5% Methanol Solution) |
|---|---|---|
| (F) | (2) | 113 ml |
| (G) | (10) | 105 ml |
| (H) | (36) | 157 ml |

Preparation of light-sensitive composition

Each of light-sensitive compositions (F) to (H) was prepared in the same manner as in the preparation of the light-sensitive composition (A), except that each of the silver halide emulsions (F) to (H) was respectively used.

Preparation of light-sensitive microcapsule

Each of dispersions containing light-sensitive microcapsules (F) to (H) was prepared in the same manner as in the preparation of the light-sensitive microcapsules (A), except that each of the light-sensitive compositions (F) to (H) was respectively used.

Preparation of light-sensitive material

Each of the light-sensitive materials (II) to (V) was prepared in the same manner as in Example 1, except that the dispersions containing light-sensitive microcapsules were used according to the combinations set forth in Table 2. In Table 2, "Infrared" means the wavelength of the spectral sensitivity to an infrared ray in each of the light-sensitive materials.

TABLE 2

| Light-Sensitive Material | Amount of Light-sensitive Microcapsule Dispersion (g) | | | | | | | | Infrared (nm) |
|---|---|---|---|---|---|---|---|---|---|
| | (A) | (B) | (C) | (D) | (E) | (F) | (G) | (H) | |
| (I) | 3.5 | 2.5 | 3.0 | — | 3.5 | — | — | — | 810 |
| (II) | 3.5 | 2.5 | 3.0 | — | — | 3.5 | — | — | 800 |
| (III) | 3.5 | 2.5 | 3.5 | — | — | — | 3.5 | — | 805 |
| (IV) | 3.5 | 2.5 | 3.0 | — | — | — | — | 3.5 | 760 |
| (V) | 3.0 | 2.2 | 2.5 | 1.3 | 3.5 | — | — | — | 810 |

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynolile dispersing device. To 200 g of the resulting dispersion were added 12 g of 50% latex of SBR (styrene-butadiene rubber) and 77 g of 8% aqueous solution of polyvinyl alcohol, and the resulting mixture was made uniform.

The mixture was then uniformly coated on a cast-coated paper having a basis weight of 65 g/m² to give a layer having a wet thickness of 36 μm and dried to obtain an image-receiving material.

Evaluation of light-sensitive material

Each of the light-sensitive material prepared in Examples 1 & 2 was imagewise exposed to light through a filter (wedge) in which the density is continuously changed, using a tungsten lamp at 200 lux for 1 second and then heated on a hot plate at 125° C. for 25 seconds. Each of the exposed and heated light-sensitive materials was then combined with the image-receiving material and passed through press rolls at a pressure of 450 kg/cm² to obtain a positive (developed) color image.

The density (sensitivity) of the obtained color image with respect to each of the three hues (yellow, magenta, cyan) was measured using Macbeth reflection densitometer.

Each of the spectral sensitivities (blue, green, red and infrared) was evaluated using each of the following filters respectively;

Blue sensitivity: blue filter which transmits only light having a wavelength of 400 to 500 nm (Fuji Band Pass Filter BPB 45: tradename of Fuji Photo Film Co., Ltd.);

Green sensitivity: green filter which transmits only light having a wavelength of 500 to 600 nm (Fuji Band Pass Filter BPB 55: tradename of Fuji Photo Film Co., Ltd.);

Red sensitivity: red filter which transmits only light having a wavelength of 600 to 700 nm (Fuji Sharp Cut Filter SC 62: tradename of Fuji Photo Film Co., Ltd.), which was used over Hoya Color Revision Filter C 500 (tradename of Hoya Glass Co., Ltd.);

Infrared sensitivity: infrared filter which transmits only light having a wavelength of not shorter than 700 nm (Fuji Sharp Cut Filter SC 72: tradename of Fuji Photo Film Co., Ltd.).

The results are set forth in Table 3. In Table 3, the sensitivity is a relative value based on the sensitivity (100) of the light-sensitive material containing light-sensitive layer comprising only microcapsules having a blue sensitivity (containing yellow color image forming substance).

TABLE 3

| Light-Sensitive Material | Spectral Sensitivity (Hue of Color Image Forming Substance) | | | |
|---|---|---|---|---|
| | Blue (Yellow) | Green (Magenta) | Red (Cyan) | Infrared (Yellow) |
| (I) | 95 | 92 | 93 | 83 |
| (II) | 95 | 92 | 93 | 76 |
| (III) | 95 | 92 | 93 | 102 |
| (IV) | 95 | 92 | 93 | 70 |
| (V) | 93 | 91 | 92 | 81 |

It is apparent from the results in Table 3, each of the light-sensitive materials of the present invention shows a high sensitivity to light with respect to each of the blue, green, red and infrared sensitivities. Therefore, the light-sensitive material of the invention can give an improved clear color image, whether the material is used for a natural color system, or for a false color system.

I claim:

1. A light-sensitive material comprising a light-sensitive layer which contains silver halide, a reducing agent, an ethylenically unsaturated polymerizable compound and a color image forming substance provided on a support, wherein the silver halide, the polymerizable compound and the color image forming substance are contained in at least four kinds of microcapsules (I), (II), (III) and (IV) which are dispersed in the light-sensitive layer, and wherein each of the microcapsules (I), (II) and (III) differs form each other with respect to the spectral sensitivity of the silver halide, the difference between the spectral sensitivity peaks of any two kinds of the microcapsules (I), (II) and (III) is not less than 60 nm, the hue of the color image forming substance contained in the microcapsule (I) is the same as that in the microcapsule (II), the hue of the color image forming substance contained in the microcapsule (III) is different from those in the microcapsules (I) and (II), the spectral sensitivity of the silver halide and the hue of the color image forming substance contained in microcapsules (IV) is different from those of microcapsules (I), (II) and (III), and said three hues of the color image forming substances contained in microcapsules (I), (II), (III) and (IV) are yellow, magenta and cyan.

2. The light-sensitive materials as claimed in claim 1, wherein the microcapsule (I) contains a blue sensitive silver halide as the silver halide, the microcapsule (II) contains an infrared sensitive silver halide as the silver halide, the microcapsule (III) contains a green sensitive silver halide as the silver halide, and the microcapsule (IV) contains a red sensitive silver halide as the silver halide.

3. The light-sensitive material as claimed in claim 1, wherein the microcapsule (I) contains a blue sensitive silver halide as the silver halide and a yellow color image forming substance as the color image forming substance, the microcapsule (II) contains an infrared sensitive silver halide as the silver halide and a yellow color image forming substance as the color image forming substance, the microcapsule (III) contains a green sensitive silver halide as the silver halide and a magenta color image forming substance as the color image forming substance, and the microcapsule (IV) contains a red sensitive silver halide as the silver halide and a cyan color image forming substance as the color image forming substance.

4. The light-sensitive material as claimed in claim 1, wherein the reducing agent is contained in the microcapsules (I), (II), (III) and (IV).

5. The light-sensitive material as claimed in claim 1, wherein each of the microcapsules (I), (II), (III) and (IV) independently contains a spectral sensitizing dye which is adsorbed on the silver halide.

6. The light-sensitive material as claimed in claim 1, wherein the light-sensitive layer further contains microcapsules (V) which differs from the microcapsules (I), (II), (III) and (IV) with respect to the spectral sensitivity of the silver halide and the hue of the color image forming substance, the microcapsule (I) contains a blue sensitive silver halide as the silver halide and a yellow color image forming substance as the color image forming substance, the microcapsule (II) contains an infrared sensitive silver halide as the silver halide and a yellow color image forming substance as the color image forming substance, the microcapsules (III) contains a green sensitive silver halide as the silver halide and a magenta color image forming substance as the color image forming substance, the microcapsule (IV) contains a red sensitive silver halide as the silver halide and a cyan color image forming substance as the color image forming substance, and the microcapsule (V) contains a black color image forming substance as the color image forming substance.

* * * * *